US005910732A

United States Patent [19]
Trimberger

[11] Patent Number: 5,910,732
[45] Date of Patent: Jun. 8, 1999

[54] PROGRAMMABLE GATE ARRAY HAVING SHARED SIGNAL LINES FOR INTERCONNECT AND CONFIGURATION

[75] Inventor: Stephen M. Trimberger, San Jose, Calif.

[73] Assignee: Xilinx, Inc., San Jose, Calif.

[21] Appl. No.: 08/816,179

[22] Filed: Mar. 12, 1997

[51] Int. Cl.[6] .............................................. H03K 19/177
[52] U.S. Cl. ................................................ 326/38; 326/41
[58] Field of Search ................................... 326/38, 39, 40, 326/41, 46

[56] References Cited

U.S. PATENT DOCUMENTS 5,237,219  8/1993  Cliff ........................................... 326/38

FOREIGN PATENT DOCUMENTS 9604496  3/1996  United Kingdom .

OTHER PUBLICATIONS

Xilinx, Inc., "The Programmable Logic Data Book," Sep. 1996, available from Xilinx, Inc., 2100 Logic Drive, San Jose, California 95124.
Betty Prince, "Semiconductor Memories", copyright 1983, 1991, John Wiley & Sons, pp. 149–174.
Anthony Stansfield et al., "The Design of a New FPGA Architecture", 1995, Computer Science 975.

*Primary Examiner*—Michael Tokar
*Assistant Examiner*—Qui Van Duong
*Attorney, Agent, or Firm*—Edel M. Young; Leroy D. Maunu, Esq.

[57] ABSTRACT

Shared signal lines for interconnection of logic elements and configuration of a programmable gate array. A signal line which is shared for purposes of interconnection and configuration saves chip space. During configuration, a shared signal line is used to route configuration bits to configuration memory cells, and during operation of the programmable gate array, the shared signal line is used to interconnect logic elements of the programable gate array.

40 Claims, 9 Drawing Sheets

PROGRAMMABLE GATE ARRAY HAVING SHARED SIGNAL LINES FOR INTERCONNECT AND CONFIGURATION

CROSS-REFERENCE TO RELATED APPLICATIONS

The present application is related to co-pending patent application, Ser. No. 08/772,804 [docket X-263], entitled, "FPGA USING RAM CONTROL SIGNAL LINES AS ROUTING OR LOGIC RESOURCES AFTER CONFIGURATION," by Thomas A. Kean, and which is assigned to the assignee of the present invention.

FIELD OF THE INVENTION

The present invention generally relates to programmable gate arrays and more particularly to a structure for configuring memory cells of a programmable gate array and for interconnecting logic elements of the programmable gate array.

BACKGROUND OF THE INVENTION

A programmable gate array (PGA) is a general purpose programmable logic device that is customizable by an end user. A PGA typically includes of an array of configuration memory cells for storing data that defines the operation of the PGA. The configuration memory cells are typically static random access memory (SRAM) cells.

PGAs generally include an array of logic elements that are arranged in rows and columns. Each logic element of a tile based SRAM PGA includes a configurable logic block, a programmable routing matrix, and a group of configuration memory cells associated with it. Each configurable logic block may perform any one of a variety of logic functions. The logic function performed by a particular logic block is defined by configuration data stored in its associated group of configuration memory cells. The programmable routing matrix allows the inputs and outputs of the logic block to be coupled to the inputs and outputs of other logic blocks or the inputs and outputs of the PGA. The couplings of the inputs and outputs of a particular logic block are similarly defined by data stored in its associated group of configuration memory cells. The programmable routing matrix, along with metal signal lines that may be connected with the routing matrix, interconnect the logic blocks of the PGA.

The output of each memory cell may be set either high or low by storing a corresponding bit in the memory cell. Storing configuration data in the memory cells of the PGA is called "configuring" the PGA. The data stored in the memory cells may be changed, or re-configured, to modify the function of the PGA.

The memory cells of the PGA are arranged as an array of cells in columns and rows. The PGA typically provides a single address register and a single data register for loading configuration data into the memory cells. The data register is typically a serial input shift register.

As semiconductor technology advances, additional chip space is available for greater numbers of logic elements as well as logic blocks having more programmable functions. In spite of the trend toward more available chip space, chip space remains a resource to be conserved. Smaller chips are cheaper to produce and operate faster. PGA chip space needs to be conserved because new functionality and capability will most often fully utilize the available chip space. Therefore, it would be desirable to have a PGA architecture that reduces usage of chip space while maintaining present capabilities and functionality.

SUMMARY OF THE INVENTION

The present invention is a programmable gate array architecture that reduces usage of chip space without reducing capabilities and functionality. The programmable gate array has signal lines that are shared for interconnecting configurable logic and for configuration of the programmable gate array. Instead of having dedicated lines for interconnection and dedicated lines for configuration as in the prior art, signal lines are shared for interconnection and configuration. Because each of the signal lines is used both for interconnection and for configuration, chip space requirements are reduced by virtue of elimination of a dedicated signal line.

The programmable gate array has a plurality of configuration memory cells. The memory cells are coupled to configurable logic blocks, and the data stored in the memory cells define the functions to be performed by the configurable logic blocks. A plurality of signal lines interconnect the configurable logic blocks and are coupled to the configuration memory cells for loading values in the configuration memory cells. Thus, a single one of the signal lines is used both for interconnecting coupled ones of the logic blocks as well as for configuring a portion of the programmable gate array.

The signal lines are coupled to a data register for receiving data to store in the configuration memory cells. An address register is used to address configuration memory cells for storing configuration data. Configuration control circuits prevent the data register from driving data on the signal lines and prevent the address register from addressing the configuration memory cells when configuration is complete.

In another aspect of the invention, a configuration bit line hierarchy is made to reduce the load placed on the shared signal line. A group bit line couples a group of memory cells to a signal line, and data is switched onto the group bit line with a single transistor. Each memory cell that is coupled to a group bit line receives configuration data via the group bit line.

A signal line may be segmented in another aspect of the invention. The segmentation of a signal line results in the load placed on each segment being less that the load on the non-segmented line.

In a manner which is similar to the sharing of signal lines for interconnections and for configuration data, other signal lines are used for interconnections and addressing of the configuration memory cells. This sharing of signal lines also reduces chip space requirements. A plurality of signal lines interconnect the programmable logic blocks and are used to address the configuration memory cells for input of data. Thus, a single one of the signal lines is used for interconnecting coupled ones of the logic blocks as well as for configuring a portion of the programmable gate array. The memory cells may also be addressed as a group to reduce the load placed on the shared lines.

DETAILED DESCRIPTION

Figure 1:
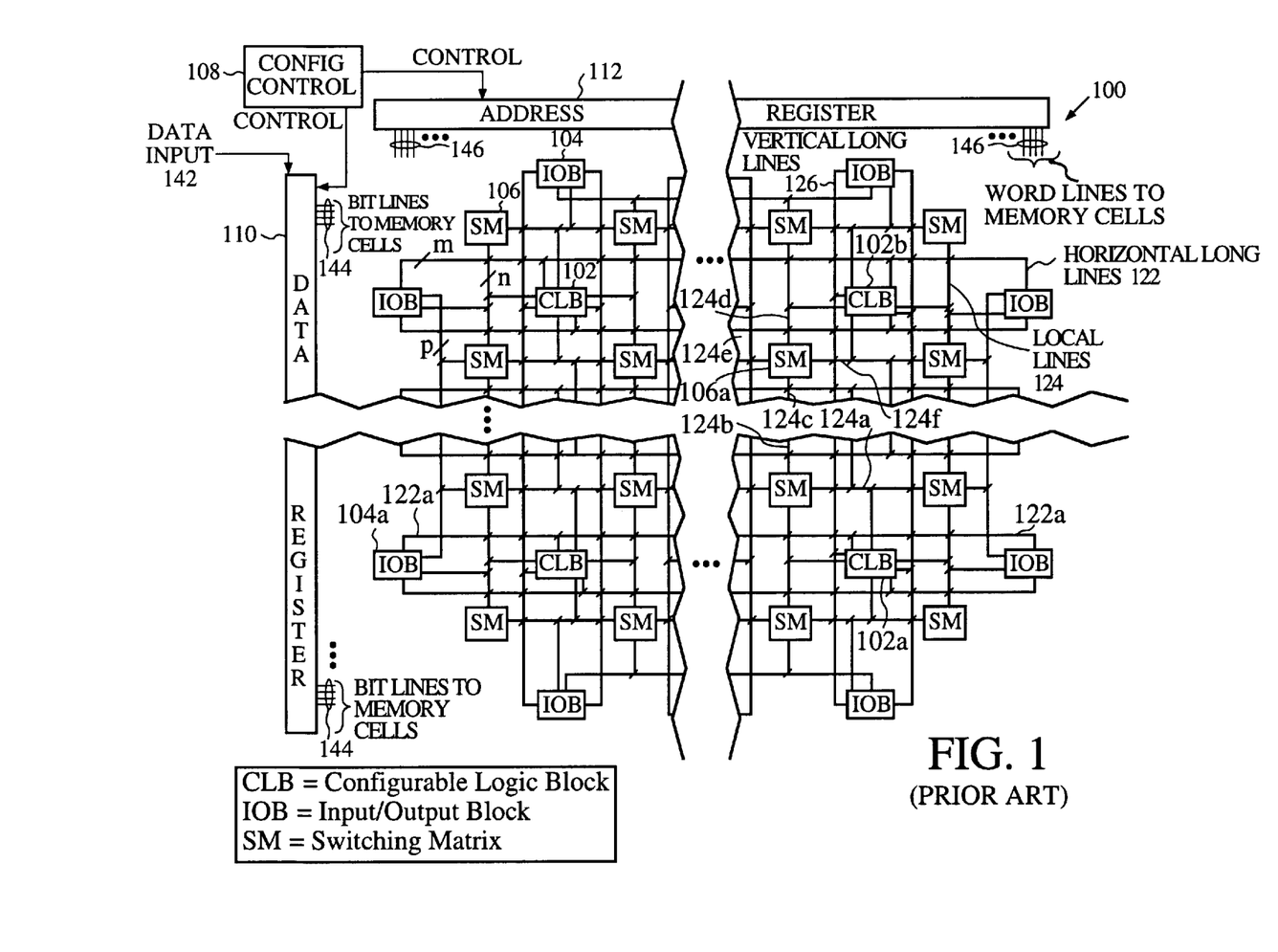
FIG. 1 is a functional block diagram of an exemplary prior art PGA.

FIG. 1 is a functional block diagram of an exemplary prior art PGA 100. The PGA 100 includes a plurality of configurable logic blocks (CLBs) 102, input/output blocks (IOBs) 104, and switch matrices (SMs) 106. A configuration control element 108, data register 110, and address register 112 are included for configuring the PGA 100.

Each of the CLBs 102 include the functional elements for constructing a user's logic and may perform any one of a variety of logic functions. The logic function performed by a particular logic block is defined by data stored in its associated group of configuration memory cells (not shown for clarity). The IOBs 104 provide the interface between the PGA package pins (not shown) and internal signal lines. Each IOB 104 controls one package pin and can be defined for input, output, or bi-directional signals. The SMs 106 include programmable interconnection points (PIPs) which are used to interconnect the CLBs 102 and IOBs 104. Additional PIPs through which CLBs 102 and IOBs 104 are capable of being coupled to interconnection lines are illustrated as small slashes at the intersections of the signal lines.

Horizontal long lines (HLLs) 122, local lines 124, and vertical long lines (VLLs) 126 provide the framework through which the CLBs 102 and IOBs 104 may be communicatively coupled. Long lines 124 and 126 span the length and width of the PGA 100, and local lines span from switch matrix 106 to switch matrix. For example, HLL 122a may be used to couple IOB 104a to CLB 102a. Local lines 124 may be used to couple one CLB to another via the switch matrices 106. For example, CLB 102a may be coupled to CLB 102b via local lines 124a, 124b, 124c, and 124d. Various combinations of HLLs 122, local lines 124, and VLLs 126 may also be used to couple the various logic elements.

HLLs 122 include m signal carrying lines where m≧1. Similarly, local lines 124 include n signal carrying lines where n>1, and VLLs 126 include p signal carrying lines where p>1. The HLLs 122 and VLLs 126 are metal interconnect segments that run the entire width of the PGA 100. Long lines are typically used for high fan-out, time-critical signal nets.

The SMs 106 include a plurality of PIPs capable of interconnecting a set of local lines. For example, SM 106a includes PIPs-capable of interconnecting local lines 124c, 124d, 124e, and 124f. By convention, local lines 124c and 124d are referred to as "vertical" local lines, and local lines 124e and 124f are referred to as "horizontal" local lines.

The apparatus for configuring the PGA 100 includes configuration control element 108, data register 110, and address register 112. The configuration control element 108 provides control for inputting data via line 142 to the data register 110 and sequencing the address register 112 to address the memory cells to be configured with the data from the data register 110. The data register drives a plurality of bit lines 144 which carry the configuration data to the configuration memory cells of the PGA 100. Similarly, the address register drives a plurality of word lines 146. An active signal on a word line 146 enables storage of data from the bit lines 144 into the configuration memory cells addressed by the word line 146.

The memory cells are preferably static random access memory cells, however, those skilled in the art will recognize that the memory cells may be implemented with other equivalent circuits such as an array of D-flip-flops or EEPROM cells. Additional details regarding the PGA 100 may be found in *The Programmable Logic Data Book*, Xilinx, Inc., 1996.

Figure 2:
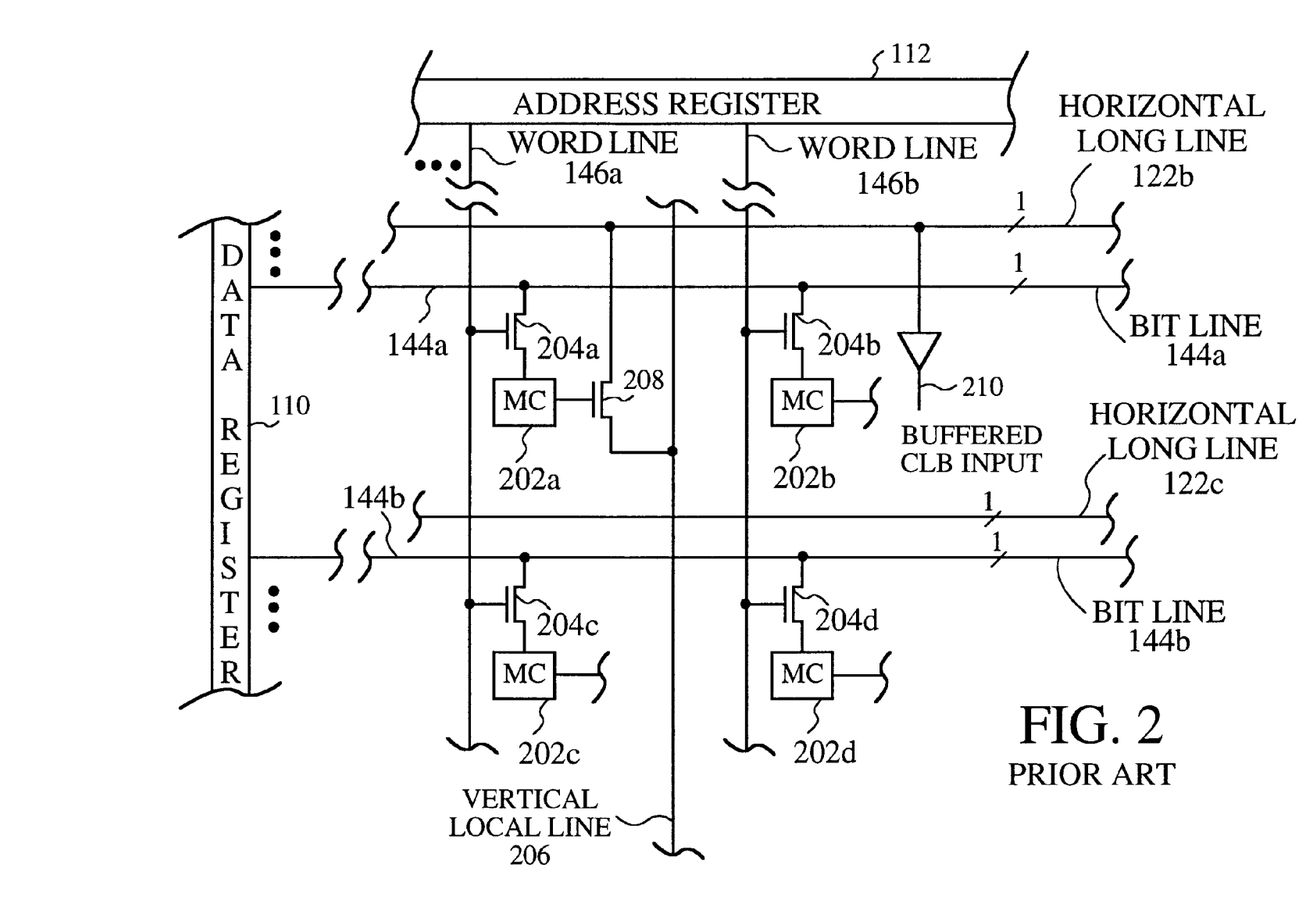
FIG. 2 is a circuit diagram of four representative configuration memory cells along with configuration bit lines and horizontal long lines of a prior art PGA.

FIG. 2 is a circuit diagram of four representative configuration memory cells 202a, 202b, 202c, and 202d, along with configuration bit lines 144a and 144b and horizontal long lines 122b and 122c of a prior art PGA 100. Bit lines 144a and 144b are driven by data register 110. Bit line 144a is coupled to provide input data signals to memory cells 202a and 202b via pass transistors 204a and 204b respectively, and bit line 144b is coupled to provide input signals to memory cells 202c and 202d via transistors 204c and 204d respectively. Word lines 146a and 146b are driven by address register 112. Word line 146a is coupled to pass transistors 204a and 204c to enable storage of data in memory cells 202a and 202c. Similarly, word line 146b is coupled to transistors 204b and 204d to enable storage of data in memory cells 202b and 202d.

For purposes of illustration, memory cell 202a controls a PIP between horizontal long line 122b and vertical local line 206. HLL 122b is coupled to vertical local line 206 via pass transistor 208. Together, memory cell 202a and transistor 208 form the PIP. A CLB (not shown) receives buffered input from HLL 122b via line 210. Memory cells 202b, 202c, and 202d are coupled to various other configurable logic elements (not shown) of the PGA 100. Also illustrated is a second HLL 122c.

Figure 3:
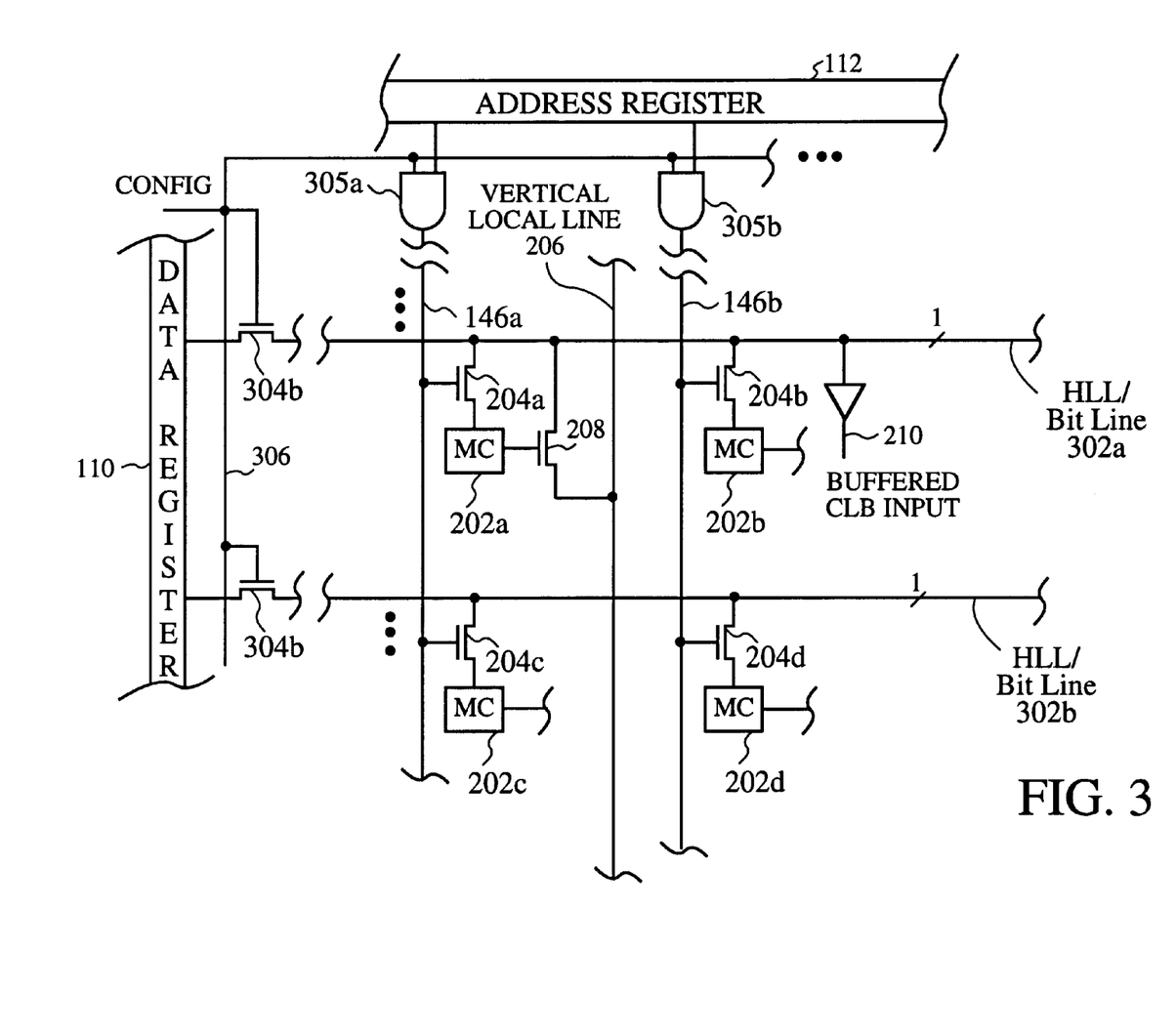
FIG. 3 is a circuit diagram of a first embodiment of the present invention in which a single metal line is used both for configuration of a PGA and for interconnections between the CLBs.

FIG. 3 is a circuit diagram of a first embodiment of the present invention in which a single metal line is used both for configuration of a PGA and for interconnections between the CLBs. Chip space is saved by using the same metal line for two functions: configuration and interconnection. Because the interconnection function is not required during configuration of the PGA, and during operation of the PGA the line is not needed for configuration, the line can be used for both purposes. While FIG. 3 shows a combined horizontal long line and bit line, those skilled in the art will recognize that juxtaposition of the data register 110 and 112 would alternatively allow a combined vertical long line and bit line.

HLL/bit line 302a illustrates a signal line that may be used for both configuration of a PGA and for interconnecting CLBs 102 and IOBs 104 in a PGA. HLL/bit line 302b may be used similarly. When used for configuration, data register 110 drives data signals on lines 302a and 302b. A CONFIG control signal is applied to transistors 304a and 304b on line 306 which allows configuration bits to be driven to the memory cells 202a, 202b, 202c, and 202d. The CONFIG control signal is also applied as input to AND gates 305a and 305b. The other inputs to AND gates 305a and 305b are the output signals of the address register 112. Thus, when both the CONFIG signal and an address output are active, the output of the respective AND gate will be active, thereby enabling storage of data in the coupled one of the memory cells 202a–d. Note that AND gates 305a–b are not required if address register 112 is structured to keep word lines 146a–b in an off state after configuration is complete.

When configuration of the PGA is complete, the configuration signal on line 306 is deactivated and the data register 110 is thereafter unable to drive configuration bit signals on lines 306a and 306b. In addition, the inactive CONFIG signal prevents the address register 112 from activating the signals on word lines 146a and 146b so that the configuration bits in memory cells 202a, 202b, 202c, and 202d are not altered by signals on the lines 302a and 302b. Transistors 204a, 204b, 204c, and 204d along with memory cells 202a, 202b, 202c, and 202d are used as described in FIG. 2. Also illustrated are the vertical local line 206 and buffered CLB input line 210. The vertical local line 206 is coupled to the HLL/bit line 302a via pass transistor 208 which is controlled by memory cell 202a. Line 210 is directly coupled to the HLL/bit line 302a in a manner which is similar to the coupling of line 210 to HLL 122b in FIG. 2.

Figure 4:
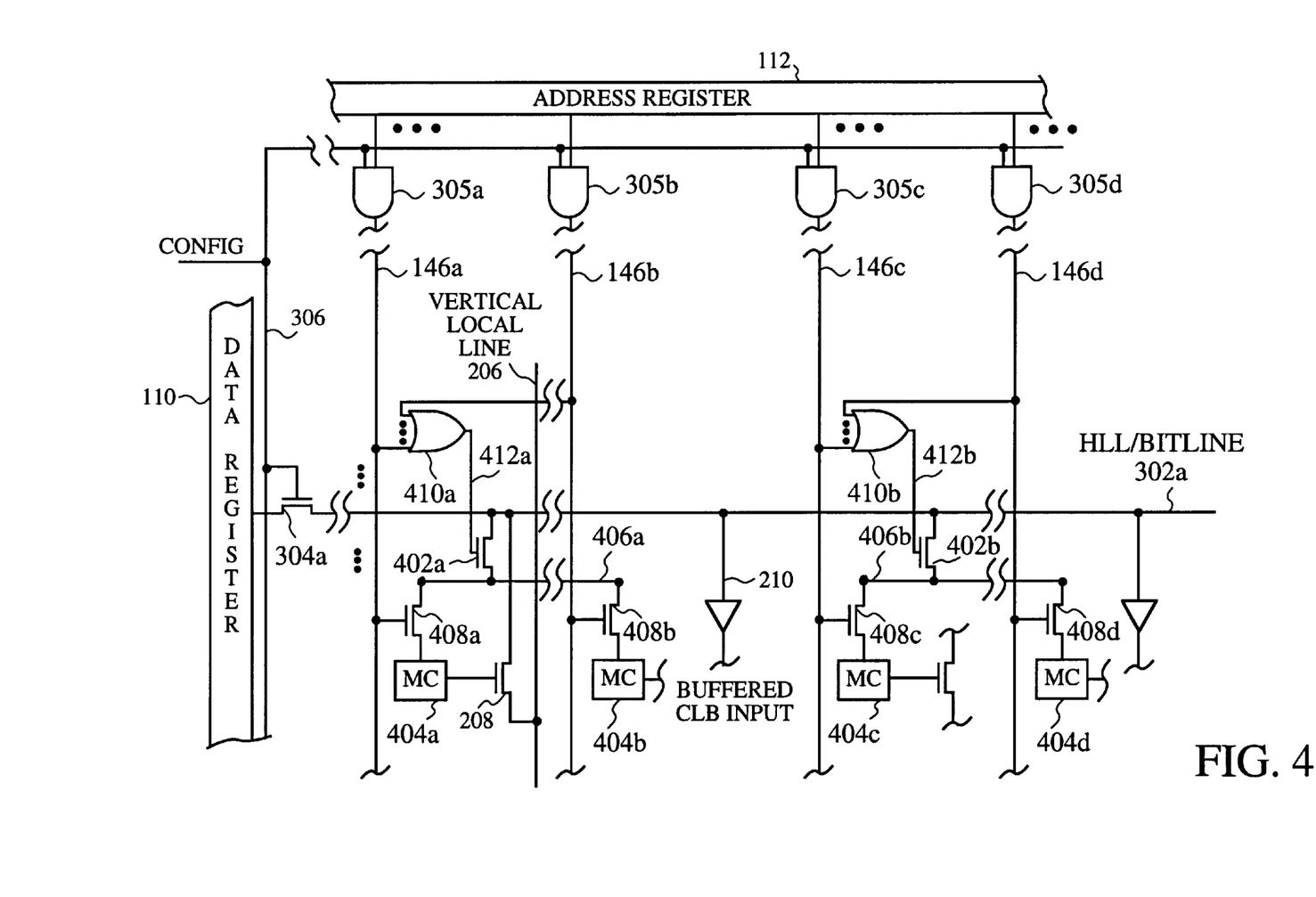
FIG. 4 is a circuit diagram of a second embodiment of the present invention in which a single metal line may be used both for configuration of a PGA and for HLL interconnections, and in which a hierarchy of bit lines is used to configure the memory cells.

FIG. 4 is a circuit diagram of a second embodiment of the present invention in which a single metal line may be used both for configuration of a PGA and for HLL interconnections, and in which a hierarchy of bit lines is used to configure the memory cells. The hierarchy is made to reduce the load placed on the HLL/bit line 302a of FIG. 3. The heavy load placed on the HLL/bit line 302a is caused by the large number of pass transistors 204a, 204b, and additional transistors which are not shown. During configuration, the heavy load is not a significant issue. However, when the PGA is operating as programmed, the load placed on the HLL/bit line 302a by the pass transistors 204a, 204b, et al. reduces the speed at which signals may be transmitted on the HLL/bit line 302a. The embodiment of FIG. 4 reduces the load placed on the HLL/bit line 302a by coupling a single pass transistor 402a to the HLL/bit line 302a to control configuration of a group of two or more memory cells, e.g., 404a and 404b. Therefore, the number of pass transistors coupled to the HLL/bit line 302a is reduced by a factor of the number of memory cells in a group, and the load on the HLL/bit line is thereby reduced.

The general apparatus used to control configuration of a given group of memory cells, e.g., 404a and 404b, includes a group pass transistor 402a, a group bit line 406a, pass transistors 408a and 408b for the respective memory cells, and a group of word lines 146a and 146b which are input into an OR gate 410a.

The pass transistor 402a is coupled to HLL/bit line 302a and to group bit line 406a. The output of OR gate 410a switches transistor 402a via line 412a. If the signal on any of word lines 146a–146b are active, the output of OR gate 410a is activated and a configuration bit is passed from HLL/bit line 302a to group bit line 406a.

A pass transistor in combination and a respective word line control storage of a configuration bit in a memory cell. For example, pass transistor 408a, which is coupled to group bit line 406a and memory cell 404a, is switched by the signal carried by word line 146a. An active signal on word line 146a results in transistor 402a being switched on, the bit signal on HLL/bit line 302a being transmitted to group bit line 406a, and in transistor 408a being switched on and memory cell 404a receiving a bit of configuration data from group bit line 406a.

To illustrate that the configuration control apparatus for memory cells 404a–404b may be replicated throughout an PGA, also shown are memory cells 404c–404d and the accompanying configuration control apparatus: word lines 146c–146d, a transistor 402b to gate group bit line 406b, transistors 408c and 408d to gate input to the memory cells 404c and 404d, and an OR gate 410b to receive signals from word lines 146c and 146d and to switch transistor 402b. For brevity, a description of parts shown in FIG. 4 and having reference numbers which are the same as reference numbers introduced in earlier FIGS. will not be repeated. The description accompanying the prior FIGS. may be referenced for further details.

While the hierarchical apparatus of FIG. 4 has more metal lines than the apparatus of FIG. 3, the overall chip space utilized by the apparatus of FIG. 4 in comparison to the apparatus of FIG. 2 is reduced because the group bit lines together (e.g., 406a and 406b and additional ones) may take up less chip space than the bit line 144a of FIG. 2.

Figure 5:
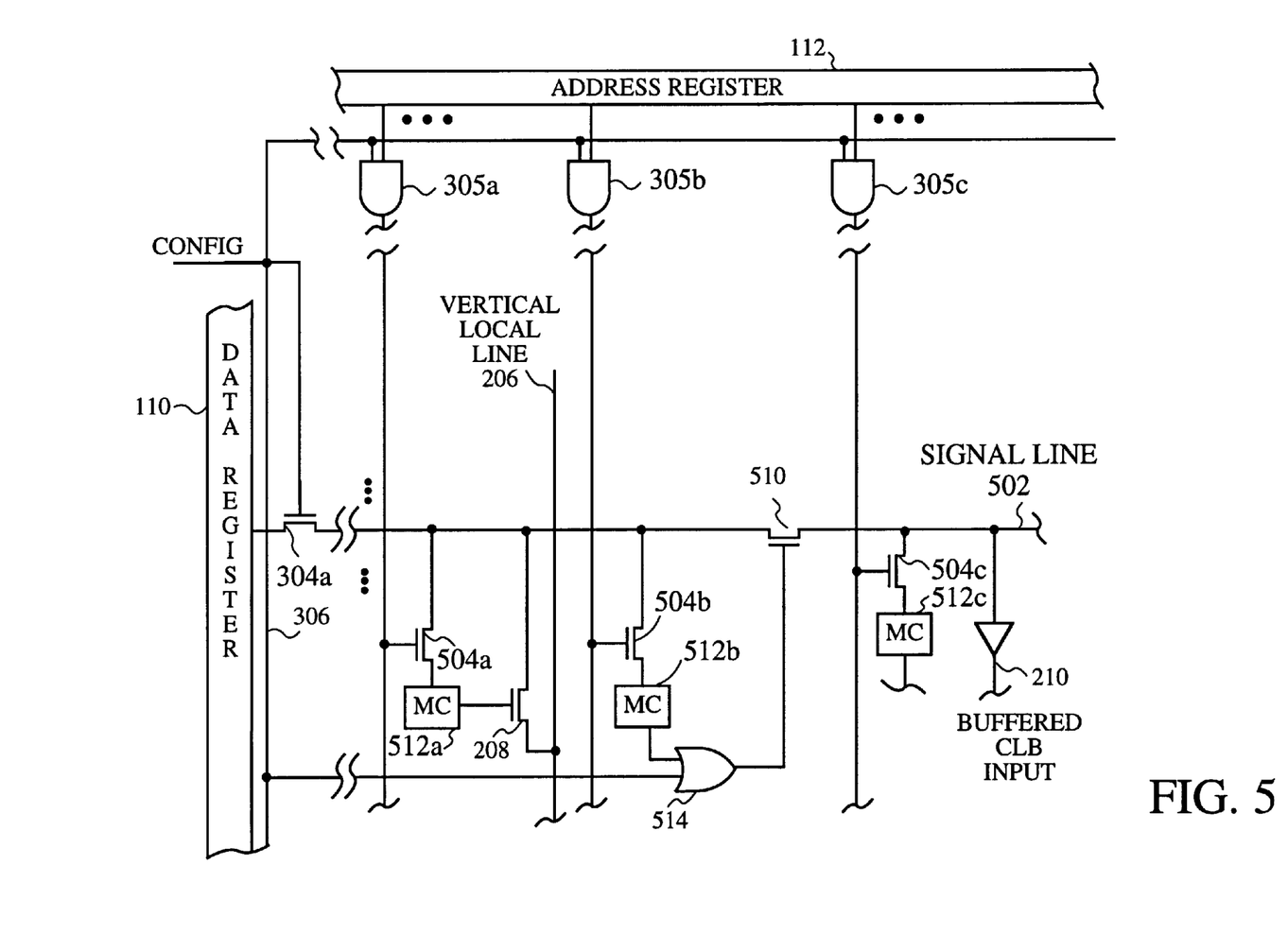
FIG. 5 is a diagram of a third embodiment of the present invention in which the configuration load on a signal line, which is used for both configuration and interconnect, is reduced by segmenting the signal line.

FIG. 5 is a diagram of a third embodiment of the present invention in which the configuration load on a signal line, which is used for both configuration and interconnect, is reduced by segmenting the signal line. The embodiment shown in FIG. 5 may be used as an alternative to or in combination with the embodiment of FIG. 4. The embodiment of FIG. 5, as with the embodiment of FIG. 4 reduces the load placed on the signal line 502 by the pass transistors 504a, 504b, 504c and the additional transistors which are not shown. Segmenting the signal line 502 reduces the load placed on each of the resulting segments, thereby improving interconnect performance.

Note that signal line 502 is referenced more generally in FIG. 5 as a "signal" line rather than as an "HLL/bit" line as in previous FIGS. This is because with the configurable segmenting approach, the local lines 124 may also be used both for interconnection of CLBs and for configuration of a PGA.

The signal line 502 is segmented with pass transistor 510 in combination with configuration memory cell 512b, the CONFIG signal on line 306, and OR gate 514. When either one of the CONFIG signal on line 306 or the signal supplied by memory cell 512b is active, the output of OR gate 514 is active and transistor 510 is switched on, thereby making signal line 502 continuous. When configuration is complete, the CONFIG signal is deactivated. Therefore, after configuration, signal line 502 will be segmented only if the configuration memory cell 512b has been configured so that an active signal is not output and supplied to OR gate 514. Thus, the signal line 502 may be selectably segmented. Note that signal line 306 need not be input to OR gate 514 if memory cell 512b can be counted on to be initialized to 1 and the memory cells 512a–c are programmed right to left.

While shown with only one transistor 510 for segmenting signal line 502, those skilled in the art will recognize that signal line 502 may be segmented into more than two segments by interposing additional transistors (in addition to 510) in the signal line 502, along with additional apparatus similar to memory cell 512 in combination with OR gate 514.

Vertical local line 206 and pass transistor 208 along with pass transistor 504a and memory cell 512a are shown to illustrate that vertical local line 206 may be selectably coupled to the signal line 502 in a manner which is similar to that described in previous FIGS. A CLB 102 may be coupled to signal line 502 to receive buffered input as shown by line 210.

Figure 6:
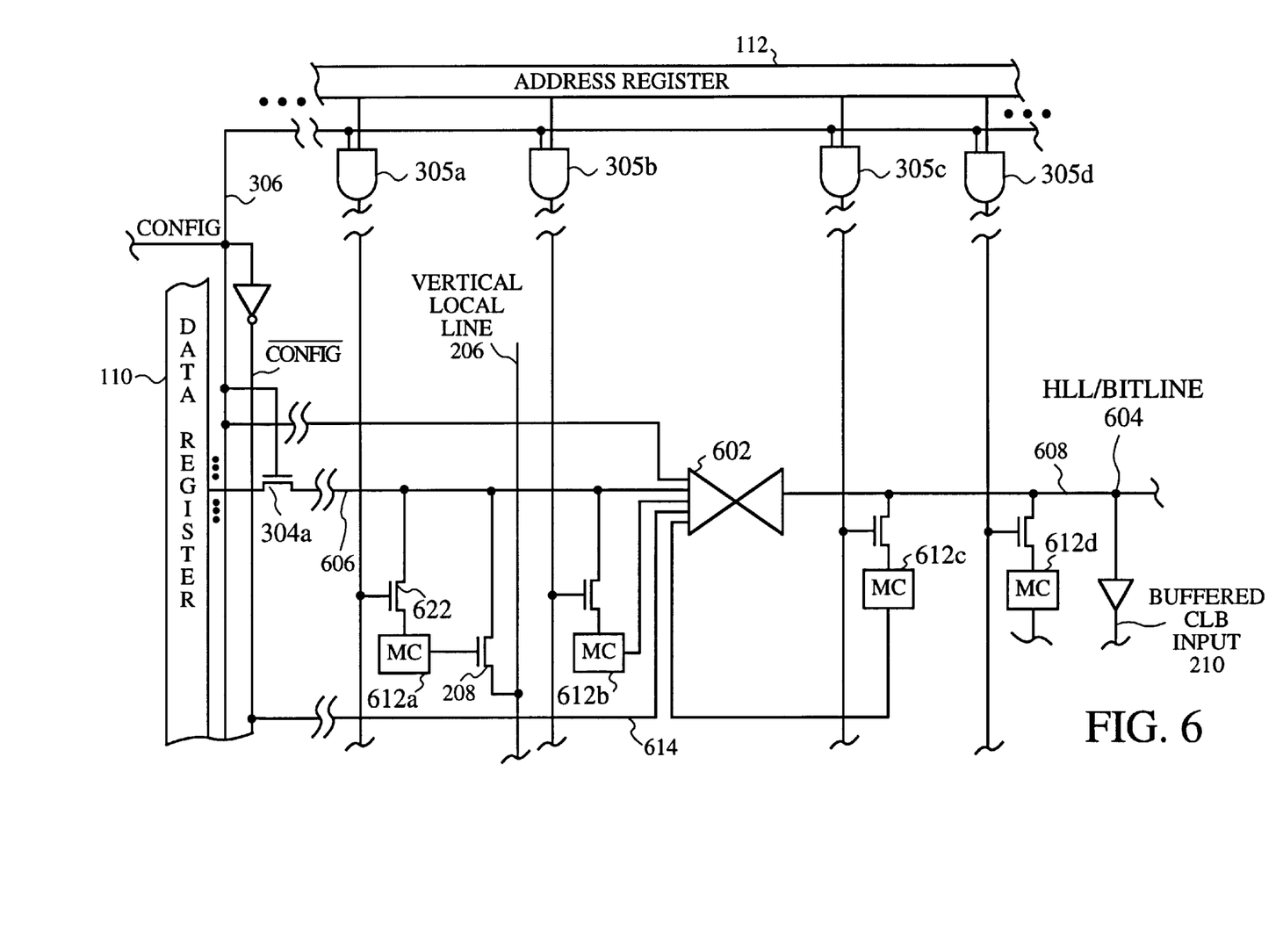
FIG. 6 is a circuit diagram of a fourth embodiment of the present invention in which a bi-directional buffer circuit is used to selectably segment the HLL/bit line and selectably control the direction of the signal drive during configuration and during operation of the PGA.

FIG. 6 is a circuit diagram of a fourth embodiment of the present invention in which a bi-directional buffer circuit 602 is used to selectably segment the HLL/bit line 604 and selectably control the direction of the signal drive during configuration and during operation of the PGA. The buffer circuit controls whether signals on the HLL/bit line 604 are driven from left-to-right, right-to-left, or in neither direction.

The HLL/bit line 604 has a left branch 606 and a right branch 608 which are coupled to the buffer circuit 602. The buffer circuit 602 selectably drives signals from the left branch 606 to the right branch 608 as determined by signals from the memory cells 612b and 612c, and the CONFIG signal on line 306 and inverted CONFIG signal on line 614. The CONFIG signal and inverted CONFIG signal are used to force the buffer circuit 602 to drive signals from the left branch 606 to the right branch 608 during configuration. The signals from the memory cells are used to segment the HLL/bit line 604 or for forcing the buffer circuit 602 to drive signals in a desired direction after configuration is complete.

Vertical local line 206 and pass transistor 208, along with pass transistor 622 and memory cell 612a, are shown to illustrate that vertical local line 206 may be selectably coupled to the HLL/bit line 604 in a manner which is similar to that described in previous FIGS. A CLB 102 may be coupled to signal line 604 to receive buffered input as shown by line 210.

Figure 7:
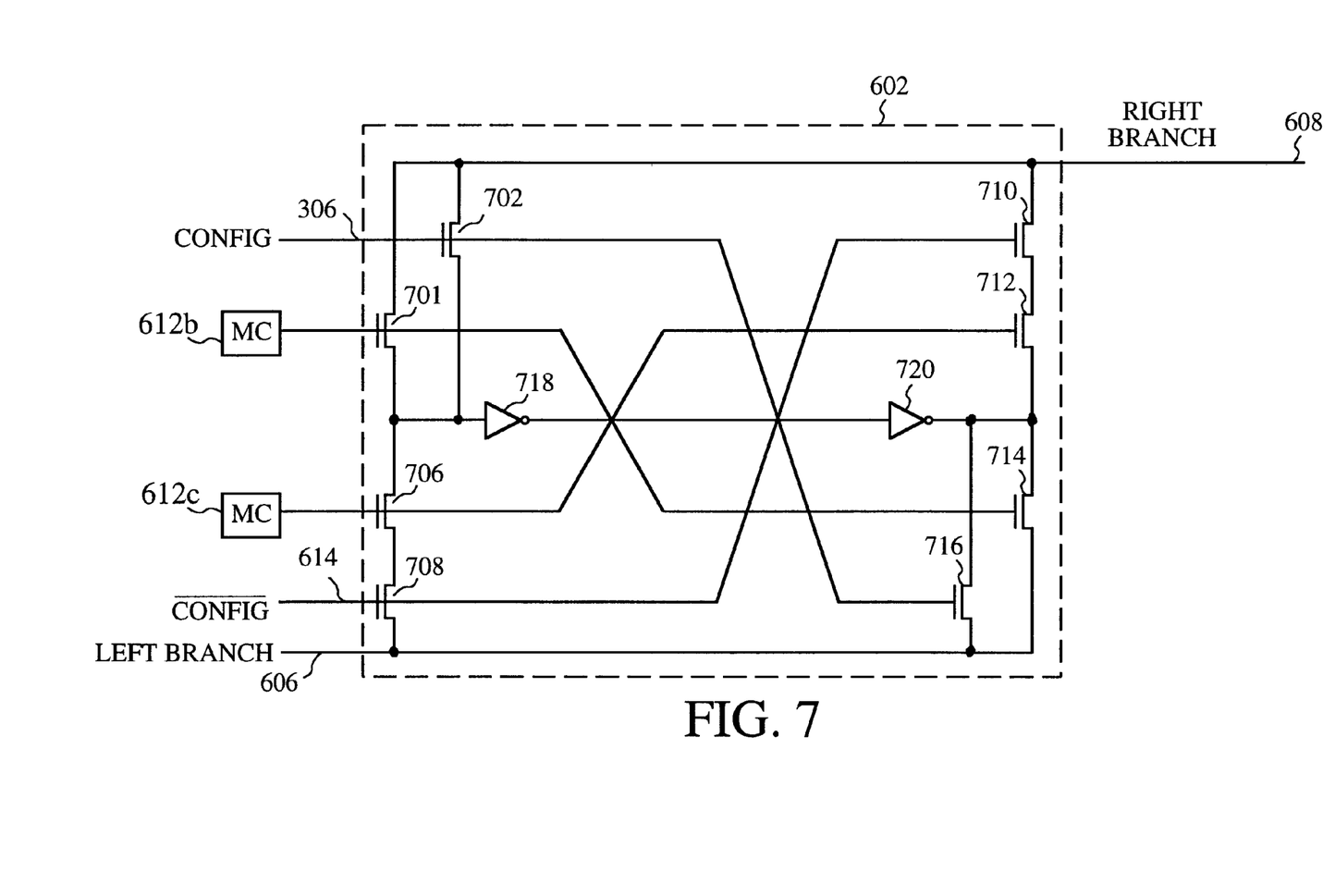
FIG. 7 is a circuit diagram of a bi-directional buffer circuit.

FIG. 7 is a circuit diagram of a bi-directional buffer circuit 602. The buffer circuit 602 is used to selectably drive signals from the left branch 606 of the HLL/bit line 604 to the right branch 608 of the HLL/bit line, from the right branch to the left branch, or in neither direction if the branches are segmented. The buffer circuit includes transistors 702–716 and inverters 718 and 720.

The CONFIG signal is applied to switch transistors 702 and 716, the output of memory cell 612b is applied to switch transistors 704 and 714, the output of memory cell 612c is applied to switch transistors 706 and 712, and the inverted CONFIG signal is applied to switch transistors 708 and 710.

When the CONFIG signal is active, signals are driven from the left branch 606 to the right branch 608, and when the inverted CONFIG signal is active, the direction of the driven signals is dependent on the outputs of the memory cells 612b and 612c. If the output of memory cell 612b is active, then signals are driven from the right branch 608 onto the left branch 606, and if the output of memory cell 612c is active, then signals are driven from the left branch 606 onto the right branch 608. If the output of neither memory cell is active, then signals are neither driven from left-to-right nor from right-to-left.

Figure 8:
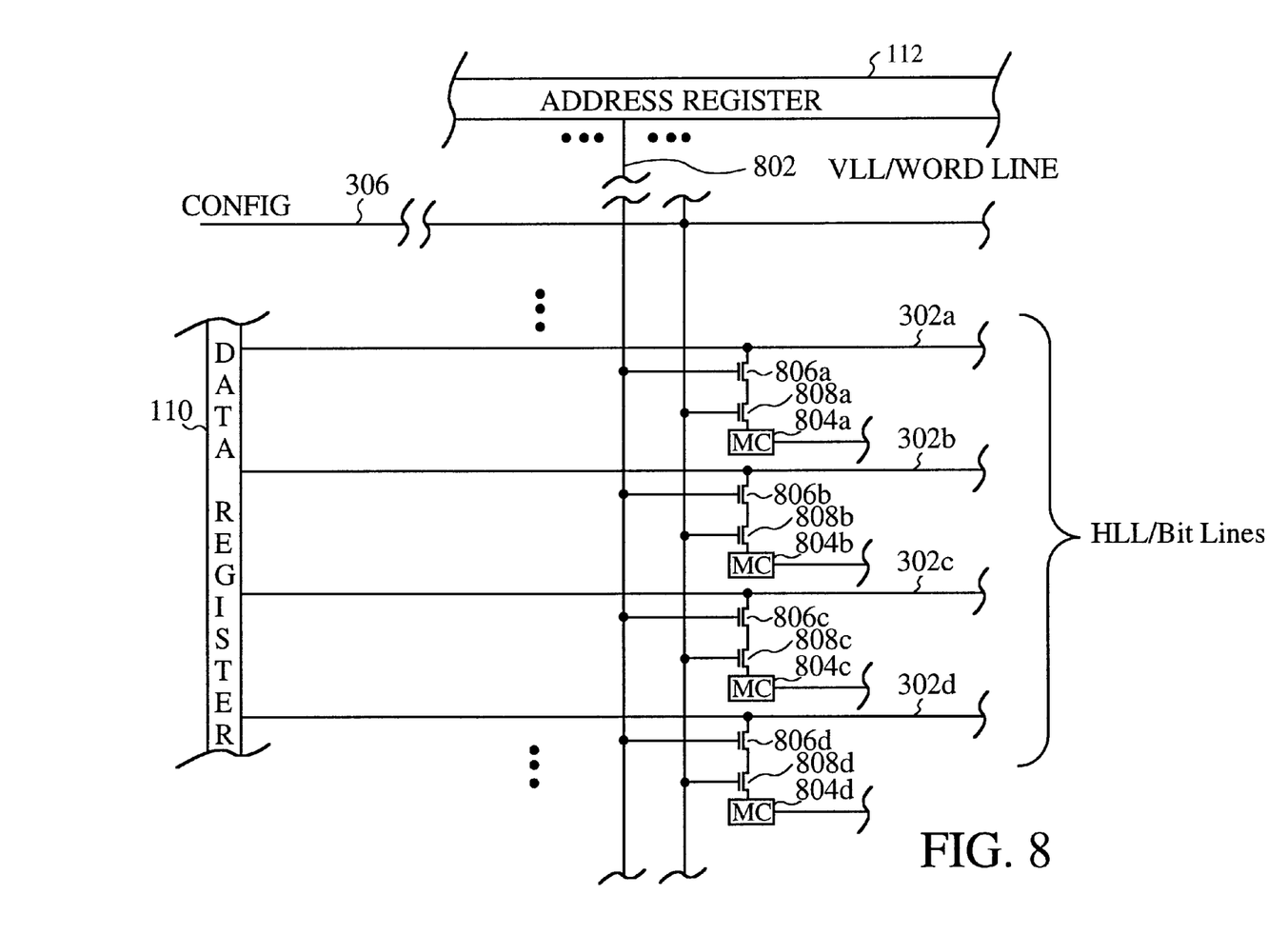
FIG. 8 is a circuit diagram of a fifth embodiment of the present invention in which a single metal line is used both for addressing configuration memory cells and for interconnections between the CLBs and IOBs.

FIG. 8 is a circuit diagram of a fifth embodiment of the present invention in which a single metal line 802 is used both for addressing configuration memory cells and for interconnections between the CLBs 102 and IOBs 104. In the illustrated embodiment, functions, which in the prior art were performed on a dedicated vertical long line 126 (FIG. 1) and a dedicated word line 146 (FIG. 2), are performed on a single VLL/word line 802.

Each memory cell 804a, 804b, 804c, and 804d has an input terminal coupled to a respective one of HLL/bit lines 302a–d. The inputs to the memory cells 804a–d are respectively switched with two pass transistors 806a–d and 808a–d. For example, the input to memory cell 804a is switched with pass transistors 806a and 808a. Transistor 806a is coupled to HLL/bit line 302a and is switched with a signal from VLL/word line 802. Transistor 808a is coupled to transistor 806a and is switched with the CONFIG signal on line 306, thereby preventing signals on VLL word line 802 from causing memory cell 804a to be inadvertently configured during operation of the PGA. When both the signal on the VLL/word line 802 and the CONFIG signal are active, the bit on the HLL/bit line 302 is stored in the memory cell 804a. Transistors 806b–d and 808b–d function similarly.

Figure 9:
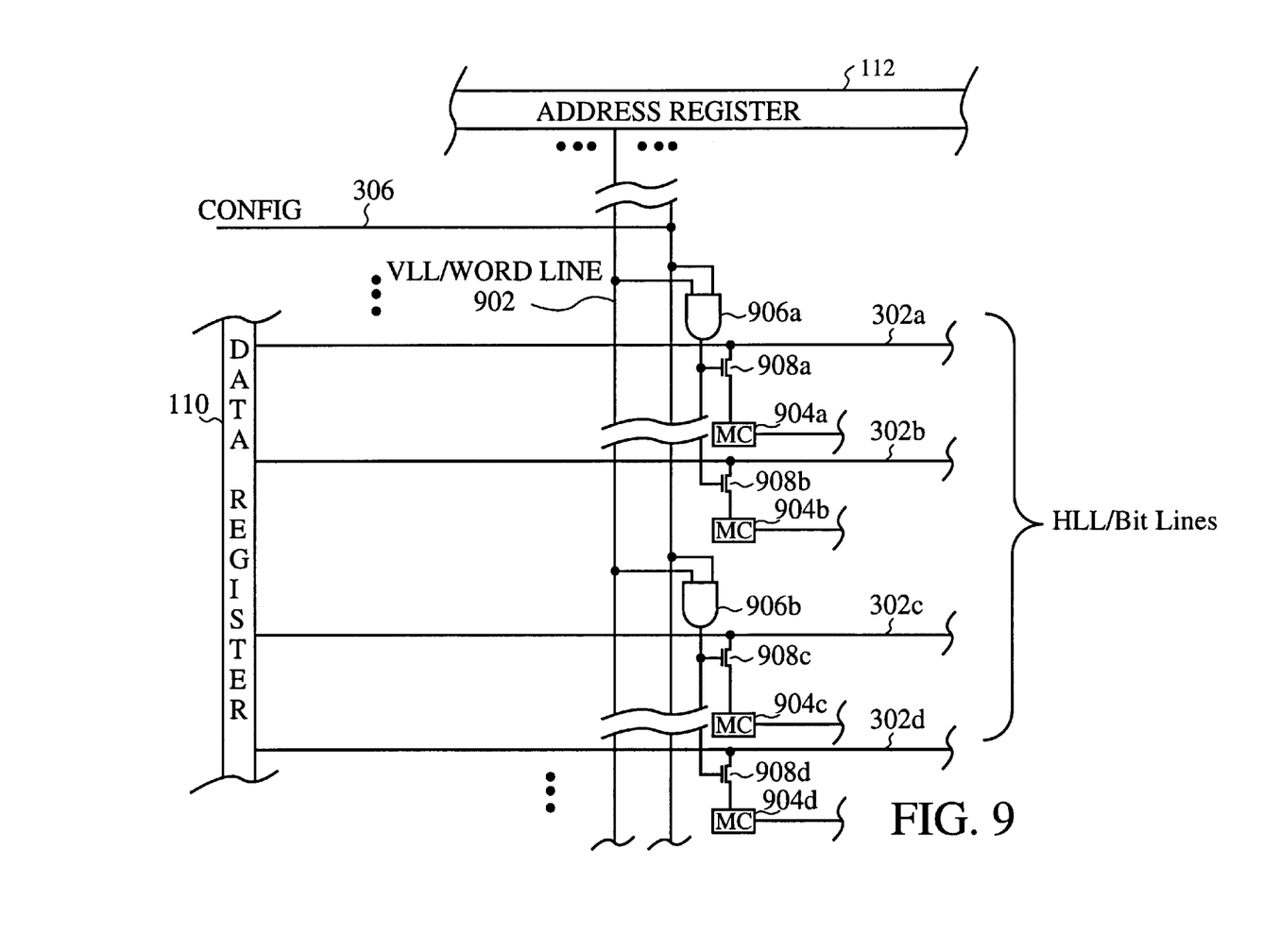
FIG. 9 is a circuit diagram of a sixth embodiment of the present invention having a VLL/word line and in which configuration of the memory cells is hierarchically controlled.

FIG. 9 is a circuit diagram of a sixth embodiment of the present invention having a VLL/word line 902 and in which configuration of the memory cells 904a–d is hierarchically controlled. As with the embodiment of FIG. 3, the embodiment of FIG. 8 results in a large load on the VLL/word line 802. The hierarchy of FIG. 9 is made to reduce the load placed on the VLL/bit line 802 of FIG. 8. The heavy load placed on the VLL/bit line 802 is caused by the large number of pass transistors 806a–d and additional transistors which are not shown. The embodiment of FIG. 9 reduces the load placed on the VLL/bit line 802 by coupling switches for a group of memory cells 904a–904b to an AND gate 906a. AND gate 906a receives as input the CONFIG signal on line 306 and the signal on VLL/word line 902. When both the CONFIG signal and the signal on VLL/word line 902 are active, AND gate 906a switches on pass transistors 908a–908b, to enable storage of bits on the HLL/bit lines 302a and 302b in memory cells 904a–904b. Similarly, transistors 908c–908d for controlling memory cells 904c–904d are coupled to AND gate 906b.

The embodiment of FIG. 9 reduces the load placed on the VLL/word line 902 by coupling an AND gate, e.g., 906a, to the VLL/word line 902 to control configuration of a group of two or more memory cells, e.g., 904a–904b. Therefore, the number of pass transistors coupled to the HLL/bit line 302a is reduced, and the load on the VLL/word line is thereby reduced.

The exemplary embodiments described herein are for purposes of illustration and are not intended to be limiting. Those skilled in the art will recognize that other embodiments could be practiced without departing from the scope and spirit of the claims set forth below. For example, the data register shown in several figures could be replaced by another data source such as a line for carrying a serial bit stream stored externally to the IC device.

What is claimed is:

1. A programmable gate array, comprising:
    a plurality of configuration memory cells;
    a plurality of configurable logic blocks, each coupled to predetermined ones of the configuration memory cells which configure logic functions to be performed by the logic blocks;
    a first plurality of signal lines, each coupled to predetermined ones of the configuration memory cells for transmission of configuration data to the configuration memory cells and interconnecting predetermined ones of the logic blocks for transmission of signals between the logic blocks;
    a data register coupled to the first plurality of signal lines for storing configuration data to be loaded into the configuration memory cells; and
    an address register coupled to the configuration memory cells for addressing configuration memory cells to be loaded with the configuration data.

2. The programmable gate array of claim 1, further comprising a plurality of switches, each having first and second current carrying terminals and a control terminal, each of the first current carrying terminals respectively coupled to an output terminal of the data register, each of the second current carrying terminals coupled to one of the first plurality of signal lines, and each of the control terminals coupled to receive a configuration signal for preventing the data register from driving configuration data onto the first plurality of signal lines when the configuration signal is inactive.

3. The programmable gate array of claim 2, further comprising:
   a second plurality of signal lines; and
   a plurality of AND gates, each having a first input terminal coupled to an output terminal of the address register, a second input terminal coupled to receive the configuration signal, and an output terminal respectively coupled to one of the second plurality of signal lines for preventing addressing of the memory cells when the configuration signal is inactive.

4. The programmable gate array of claim 1, further comprising means for disconnecting the data register from the first plurality of signal lines after completion of configuration.

5. The programmable gate array of claim 4, further comprising means for disconnecting the address register from the configuration memory cells after completion of configuration.

6. The programmable gate array of claim 1, further comprising a plurality of group bit lines, each coupling one of the first plurality of signal lines to a group of configuration memory cells.

7. The programmable gate array of claim 6, further comprising:
   a second plurality of signal lines, each coupled to the address register and to means for addressing predetermined ones of the memory cells for addressing the memory cells;
   a first plurality of OR gates, each having an output terminal, and a plurality of input terminals coupled to predetermined-ones of the second plurality of signal lines for activating an output signal in response to an active signal at the input terminals; and
   a first plurality of switches, each having a first current carrying terminal, a second current carrying terminal, and a control terminal, the first current carrying terminal coupled to one of the first plurality of signal lines and the second current carrying terminal coupled to a respective one of the group bit lines, and the control terminal coupled to the output terminal of a respective one of the OR gates.

8. The programmable gate array of claim 7, further comprising a second plurality of switches, each disposed at a predetermined position on a respective one of the first plurality of signal lines for segmenting the respective signal line into two branches, and each having a first current carrying terminal, a second current carrying terminal, and a control terminal, the first and second current carrying terminals coupled to connect the two branches of the signal line and the control terminal coupled to one of the memory cells to control segmenting the respective signal line.

9. The programmable gate array of claim 8, further comprising a second plurality of OR gates, each having an output terminal coupled to a control terminal of a respective one of the second plurality of switches, and having a first input terminal coupled to one of the memory cells and a second input terminal coupled to receive a configuration signal for connecting the two branches of the signal line during configuration.

10. The programmable gate array of claim 6, further comprising means for gating signals from the first plurality of signal lines to coupled group bit lines.

11. The programmable gate array of claim 6, further comprising means for segmenting selectable ones of the first plurality of signal lines.

12. The programmable gate array of claim 1, further comprising a second plurality of switches, each disposed at a predetermined position on a respective one of the first plurality of signal lines for segmenting the respective signal line into two branches, and each having a first current carrying terminal, a second current carrying terminal, and a control terminal, the first and second current carrying terminals coupled to connect the two branches of the signal line and the control terminal coupled to one of the memory cells to control segmenting the respective signal line.

13. The programmable gate array of claim 12, further comprising a plurality of logic gates, each having an output terminal coupled to a control terminal of a respective one of the second plurality of switches and having a first input terminal coupled to one of the memory cells and a second input terminal coupled to receive the configuration signal for connecting the two branches of the signal line during configuration.

14. The programmable gate array of claim 1, further comprising segmentation means for segmenting selectable ones of the first plurality of signal lines.

15. The programmable gate array of claim 1, further comprising a plurality of bi-directional buffer circuits, each coupled to a first branch and a second branch of a respective one of the first plurality of signal lines for selectably driving signals from the first branch to the second branch or from the second branch to the first branch.

16. The programmable gate array of claim 15, wherein each of the bi-directional buffer circuits includes means for segmenting the first branch from the second branch of the respective one of the plurality of signal lines.

17. The programmable gate array of claim 1, further comprising a second plurality of signal lines, each coupled to predetermined ones of the memory cells for addressing the memory cells and interconnecting predetermined ones of the logic blocks for transmission of signals between the logic blocks.

18. The programmable gate array of claim 17, further comprising a plurality of group address lines, each coupling one of the second plurality of signal lines to a group of memory cells.

19. The programmable gate array of claim 18, further comprising means for gating signals from the second plurality of signal lines to the group address lines.

20. The programmable gate array of claim 18, further comprising a plurality of group bit lines, each coupling one of the first plurality of signal lines to a group of memory cells.

21. The programmable gate array of claim 20, further comprising means for segmenting selectable ones of the first plurality of signal lines.

22. The programmable gate array of claim 17, further comprising means for segmenting selectable ones of the first plurality of signal lines.

23. A programmable gate array, comprising:
   a plurality of configuration memory cells;
   a plurality of configurable logic blocks, each coupled to predetermined ones of the memory cells for configuring logic functions to be performed by the logic blocks;

a first plurality of signal lines, each coupled to predetermined ones of the memory cells for addressing the memory cells and interconnecting predetermined ones of the logic blocks for transmission of signals between the logic blocks;

a data register coupled to the configuration memory cells for storing configuration data to be loaded into the configuration memory cells; and an address register coupled to the configuration memory cells via the signal lines for addressing configuration memory cells to be loaded with the configuration data.

24. The programmable gate array of claim 23, further comprising:

a second plurality of signal lines, each interconnecting predetermined ones of the logic blocks for transmission of signals between the logic blocks;

a plurality of paired switches, the switches in a pair serially coupled one to the other, and each pair including a first switch coupled to one of the second plurality of signal lines and a second switch coupled to one of the memory cells, the first switch controlled by one of the first plurality of signal lines, and the second switch controlled by a configuration signal.

25. The programmable gate array of claim 23, further comprising:

a second plurality of signal lines, each interconnecting predetermined ones of the logic blocks for transmission of signals between the logic blocks;

a plurality of switches, each coupled to a respective one of the memory cells and to one of the second plurality of signal lines, and each having a control terminal; and a plurality of AND gates, each having an output terminal coupled to the control terminals of a group of predetermined ones of the switches, and having a first input terminal coupled to one of the first plurality of signal lines and a second input terminal coupled to receive a configuration signal.

26. The programmable gate array of claim 23, further comprising:

a plurality of group address lines, each coupled to address a predetermined group of memory cells; and means for gating address signals from the first plurality of signal lines to the group address lines.

27. The programmable gate array of claim 23, further comprising means for disconnecting the address register from the signal lines after completion of configuration.

28. A programmable gate array comprising:

a plurality of memory cells for configuring the gate array;

a plurality of conductive lines; and a mode control structure having:

a configuration mode in which selected ones of said conductive lines are connected to a data source and to selected ones of said memory cells, thereby configuring said selected ones of said memory cells; and an operation mode in which said data source and said memory cells are disconnected from said conductive lines.

29. A programmable gate array as in claim 28 wherein one of said memory cells causes connection to be made between one of said conductive lines and another conductive line.

30. A programmable gate array as in claim 29 wherein said one of said conductive lines is that line through which said one of said memory cells is configured.

31. A programmable gate array as in claim 28 wherein one of said memory cells causes a logic block to perform a selected function.

32. A programmable gate array as in claim 28 wherein said mode control structure comprises:

switches each having two current carrying terminals for connecting one of said memory cells to one of said conductive lines and having a control terminal;

an address register;

address lines for connecting said address register to said control terminals of said switches; and data lines for connecting said data source to said current carrying terminals of said switches.

33. A programmable gate array as in claim 28 wherein one of said conductive lines is connected to a plurality of said memory cells through a single switch.

34. A programmable gate array as in claim 33 further comprising an address register having a plurality of address lines, each address line connecting at least one memory cell loading switch to a corresponding memory cell and to said single switch, said single switch being controlled by said plurality of said address lines.

35. A programmable gate array as in claim 28 wherein one of said conductive lines comprises at least two segments connectable by a segmentation switch, said segmentation switch being controlled to connect said at least two segments when said memory cells are being configured.

36. A programmable gate array as in claim 35 wherein said segmentation switch programmably connects said two segments when said memory cells are not being configured.

37. A programmable gate array as in claim 35 wherein said segmentation switch is a bidirectional buffer controlled to conduct signals away from said data source when said memory cells are being configured.

38. A programmable gate array as in claim 37 wherein the direction of said bidirectional buffer when said memory cells are not being configured is selected by at least one of said memory cells.

39. A programmable gate array as in claim 38 wherein the direction and conductivity of said bidirectional buffer are controlled by two of said memory cells.

40. A programmable gate array comprising:

a plurality of memory cells for configuring the gate array;

a plurality of conductive lines; and a mode control structure having:

a configuration mode in which selected ones of said conductive lines are connected to an address source and to means for accessing selected ones of said memory cells, whereby said selected ones of said memory cells can be configured; and an operation mode in which said address source and said memory cells are disconnected from said conductive lines.

* * * * *